(12) United States Patent
Miyasaka et al.

(10) Patent No.: US 7,530,277 B2
(45) Date of Patent: May 12, 2009

(54) MEASURING APPARATUS

(75) Inventors: Takao Miyasaka, Ueda (JP); Akihiro Nagai, Ueda (JP); Yusaku Miyata, Ueda (JP); Tomoyuki Inoue, Ueda (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 143 days.

(21) Appl. No.: 11/668,248

(22) Filed: Jan. 29, 2007

(65) Prior Publication Data

US 2007/0176895 A1 Aug. 2, 2007

(30) Foreign Application Priority Data

Jan. 30, 2006 (JP) ............................. 2006-020584
Sep. 8, 2006 (JP) ............................. 2006-243729

(51) Int. Cl.
*G01N 3/02* (2006.01)
(52) U.S. Cl. ......................................... 73/856; D10/79
(58) Field of Classification Search ................... 73/856; 324/685; D10/79
See application file for complete search history.

(56) References Cited

U.S. PATENT DOCUMENTS

| 7,016,703 | B2 * | 3/2006 | Kishimoto et al. | 455/566 |
| D560,130 | S * | 1/2008 | Nagai et al. | D10/79 |
| 7,339,600 | B2 * | 3/2008 | Hwang | 345/659 |
| 2007/0015551 | A1 * | 1/2007 | Iwama et al. | 455/575.3 |
| 2007/0108992 | A1 * | 5/2007 | Yanagisawa | 324/658 |
| 2007/0164723 | A1 * | 7/2007 | Yanagisawa | 324/76.11 |

FOREIGN PATENT DOCUMENTS

| JP | 11-295349 | 10/1999 |
| JP | 2002-300237 | 10/2002 |
| JP | 2002-320012 | 10/2002 |
| JP | 2003-060751 | 2/2003 |
| JP | 2003-302423 | 10/2003 |
| JP | 2004-361248 | 12/2004 |
| JP | 2005-099845 | 4/2005 |

OTHER PUBLICATIONS

U.S. Appl. No. 11/539,891 to Yanagisawa, which was filed on Oct. 10, 2006.

(Continued)

*Primary Examiner*—Harshad Patel
*Assistant Examiner*—Freddie Kirkland, III
(74) *Attorney, Agent, or Firm*—Greenblum & Bernstein, P.L.C.

(57) ABSTRACT

A measuring apparatus has a display unit that can be favorably viewed when a measured object is clamped by a clamp-type sensor regardless of the orientation and position of the measured object. The measuring apparatus includes a first main unit on which the clamp-type sensor is disposed and a second main unit that is rotatably connected to the first main unit and on which the display unit is disposed. The second main unit is connected to the first main unit via a hinge unit capable of maintaining an arbitrary rotation position. The display unit is disposed on a surface of the second main unit that is opposite the first main unit when the measuring apparatus is folded up.

1 Claim, 8 Drawing Sheets

OTHER PUBLICATIONS

U.S. Appl. No. 11/611,333 to Yanagisawa, which was filed on Dec. 15, 2006.
English language Abstract of JP 11-295349.
English language Abstract of JP 2003-302423.
English Language Abstract of JP 2002-300237.
English Language Abstract of JP 2002-320012.
English Language Abstract of JP 2005-099845.
English Language Abstract of JP 2003-060751.
English Language Abstract of JP 2004-361248.

* cited by examiner

MEASURING APPARATUS

BACKGROUND OF THE INVENTION

1. Field of the Invention

The present invention relates to a measuring apparatus that measures at least one of a temperature and an electrical characteristic, such as current, of a measured object.

2. Description of the Related Art

As one example of this type of measuring apparatus, a first clamp-type ammeter (hereinafter simply "ammeter") is disclosed by the present applicant in Japanese Laid-Open Patent Publication No. H11-295349. This ammeter includes a liquid crystal display unit (hereinafter simply "display unit") for digitally displaying a measured value, an instrument body on which operation buttons, an operation dial, and opening/closing levers are disposed, and a clamp sensor that is attached to the instrument body so as to be capable of opening and closing when the opening/closing levers are operated and maintains a substantially annular form in its closed state. When measuring current, the ammeter is attached to the measured object, for example, a cable, by clamping the measured object with the clamp sensor (here "clamping" refers to a state where the measured object passes through the clamp sensor that maintains a substantially annular form).

As another example of this type of measuring apparatus, a second ammeter is disclosed by the present applicant in Japanese Laid-Open Patent Publication No. 2003-302423. In this ammeter, a conductor-introducing unit (a clamp-type sensor unit) is disposed at one end of the instrument body on which the operation dial, the display unit, and the like are disposed. When measuring the current flowing through a measured object using this ammeter, the operation dial is switched to a desired measurement range and the measured object is clamped by the conductor-introducing unit. When doing so, a control unit disposed on the instrument body calculates the current based on the voltage induced in a coil which is provided in the conductor-introducing unit and is used to detect current. A measurement screen in which the calculation result has been converted to a numeric value, for example, is displayed on a display unit. By doing so, the measurement process is completed.

SUMMARY OF THE INVENTION

However, by investigating the measuring apparatuses described above, the present inventors found the following issue to be improved. That is, with the former measuring apparatus (i.e., the first ammeter) out of the measuring apparatuses described above, the clamp sensor is directly attached to the instrument body on which the display unit is disposed. Accordingly, with this measuring apparatus, when the measured object is clamped with the clamp sensor to attach the measuring apparatus to the measured object, depending on the orientation and position of the measured object, there is the risk of the display unit disposed on the instrument body becoming located at a position that is difficult to view, which can make the measuring operation difficult to carry out. This issue should be improved.

On the other hand, the latter measuring apparatus (i.e., the second ammeter) out of the two measuring apparatuses described above is constructed with the conductor-introducing unit (i.e., the sensor unit) disposed at one end of the instrument body on which the display unit is disposed. Depending on the position and posture of the measured object whose current or the like is being measured, there are cases where the ammeter becomes horizontal or upside-down when the measured object is being clamped by the conductor-introducing unit. In this state, the display screen displayed by the display unit will become horizontal or upside down in the same way as the ammeter. Accordingly, with this ammeter also, there is the issue of the display screen displayed by the display unit becoming difficult to view.

The present invention was conceived in view of the issue to be improved described above and it is a principal object of the present invention to provide a measuring apparatus where a display unit can be favorably viewed regardless of the orientation and position of the measured object. It is a further object to provide a measuring apparatus where a screen can be easily viewed.

To achieve the stated principal object, a first measuring apparatus according to the present invention includes: a first main unit on which a clamp-type sensor capable of clamping a measured object is disposed; and a second main unit that is rotatably connected to the first main unit and on which a display unit is disposed.

According to this first measuring apparatus, by rotatably connecting the second main unit on which the display unit is disposed to the first main unit on which the clamp-type sensor capable of clamping a measured object is disposed and rotating the second main unit, it is possible to favorably place the display unit at a position that is easy to view regardless of the orientation and the position of the measured object clamped by the clamp-type sensor. As a result, by using the above measuring apparatus, it is possible to sufficiently facilitate measurement operations. Clamp-type sensors are normally constructed so that a pair of facing end surfaces touch each other in the clamped (i.e., closed) state, and since it is easy for such facing end surfaces to become separated when a large external force is applied to the sensor, this can cause a drop in measurement accuracy. This kind of external force can often occur when the measuring apparatus is twisted to make the display unit easier to view in a state where the measured object is clamped by the clamp-type sensor, but with the first measuring apparatus according to the present invention described above, the second main unit on which the display unit is disposed is rotatably connected to the first main unit on which the sensor is disposed. This means that by rotating the second main unit, it is possible to always place the display unit at a position that is easy to view without applying an unnecessary external force to the sensor. Accordingly, since it is possible to always keep the pair of facing end surfaces of the sensor in a favorably connected state, measurement processes can be carried out without a drop in the measurement accuracy.

With the first measuring apparatus described above, the second main unit may be connected to the first main unit via a hinge unit capable of maintaining an arbitrary rotation position. With this construction, it becomes no longer necessary to hold the second main unit by hand at a position where the display unit is easy to view. This means the operator can freely use both hands and can write down the measurement results, for example, which makes it possible to further facilitate measuring operations.

With the first measuring apparatus described above, the first main unit and the second main unit may be capable of being folded onto one another. With this construction, it is possible to make the measuring apparatus more compact when not in use, which gives the measuring apparatus favorable portability.

With the first measuring apparatus described above, the display unit may be disposed on a surface of the second main unit that is opposite the first main unit when the first main unit and the second main unit are folded onto one another. With this construction, the display unit can be protected while the measuring apparatus is being carried.

The first measuring apparatus described above may further include a first operation unit that is disposed on the second main unit. With the construction described above, by rotating the second main unit, it is possible to always place the first operation unit at a position where the first operation unit is easy to operate, regardless of the orientation and position of the measured object. As a result, it is possible to make measurement operations even easier.

Also, with the first measuring apparatus described above, the first operation unit may be disposed on the surface of the second main unit. With this construction, it is possible to simultaneously achieve both favorable visibility for the display unit and favorable operability for the first operation unit, regardless of the orientation and position of the measured object. Also, by disposing both the display unit and the first operation unit on the surface of the second main unit that faces the first main unit when the measuring apparatus is folded up, it is possible to simultaneously protect both the display unit and the operation unit during transportation and the like of the measuring apparatus.

To achieve the further object stated above, a second measuring apparatus according to the present invention has the same construction as the first measuring apparatus described above but is further equipped with a display control unit that has a screen displayed on the display unit, wherein the display control unit is operable when a screen rotation designating signal is outputted, to rotate the screen by a predetermined angle and to have the display unit display the screen. Note that the expression "screen" for the present invention includes not only a "measurement screen" such as a "measurement process screen" displayed during execution of a measurement process and a "measurement result display screen" that displays measurement results but also a variety of display screens such as an "operation condition setting screen" that sets operation conditions for the measuring apparatus and a "help screen" that displays how to use the measuring apparatus.

According to the second measuring apparatus, due to the display control unit rotating the screen by a predetermined angle and having the display unit display the rotated screen when the screen rotation designating signal is outputted, unlike a conventional ammeter constructed so that the measurement screen is displayed in a fixed manner and is easy to view only when the measured object has been clamped so that the conductor-introducing unit (i.e., the sensor unit) is positioned above the display unit, it will be possible to easily view the screen even when the measuring apparatus is horizontal or is upside down.

The second measuring apparatus described above may further include a rotation detecting unit that detects rotation of the second main unit with respect to the first main unit and outputs the screen rotation designating signal, and the display control unit may be operable when the screen rotation designating signal is outputted from the rotation detecting unit, to rotate the screen by the predetermined angle and to have the display unit display the rotated screen. With this construction, by merely rotating the second main unit with respect to the first main unit without carrying out a switch operation or the like to rotate the screen, it is easy to have the display unit display a screen that is easy to view when the measuring apparatus is folded up and a screen that is easy to view when the measuring apparatus is opened.

The second measuring apparatus described above may further include a second operation unit including a rotation operation switch that rotates the screen, and the display control unit may be operable when the screen rotation designating signal is outputted from the second operation unit, to rotate the screen by the predetermined angle and to have the display unit display the rotated screen. With this construction, by operating the rotation operation switch in accordance with the posture of the measuring apparatus, it is possible to have the screen displayed on the display unit having been arbitrarily rotated so as to make the screen easy to view.

It should be noted that the disclosure of the present invention relates to the contents of Japanese Patent Application 2006-20584 that was filed on 30 Jan. 2006 and Japanese Patent Application 2006-243729 that was filed on 8 Sep. 2006, the entire contents of both of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a measuring apparatus according to the present invention will now be described with reference to the attached drawings. Note that an ammeter equipped with a clamp-type sensor will be described as one example of a measuring apparatus.

First Embodiment

First, the construction of an ammeter 1 will be described with reference to the drawings.

Figure 1:
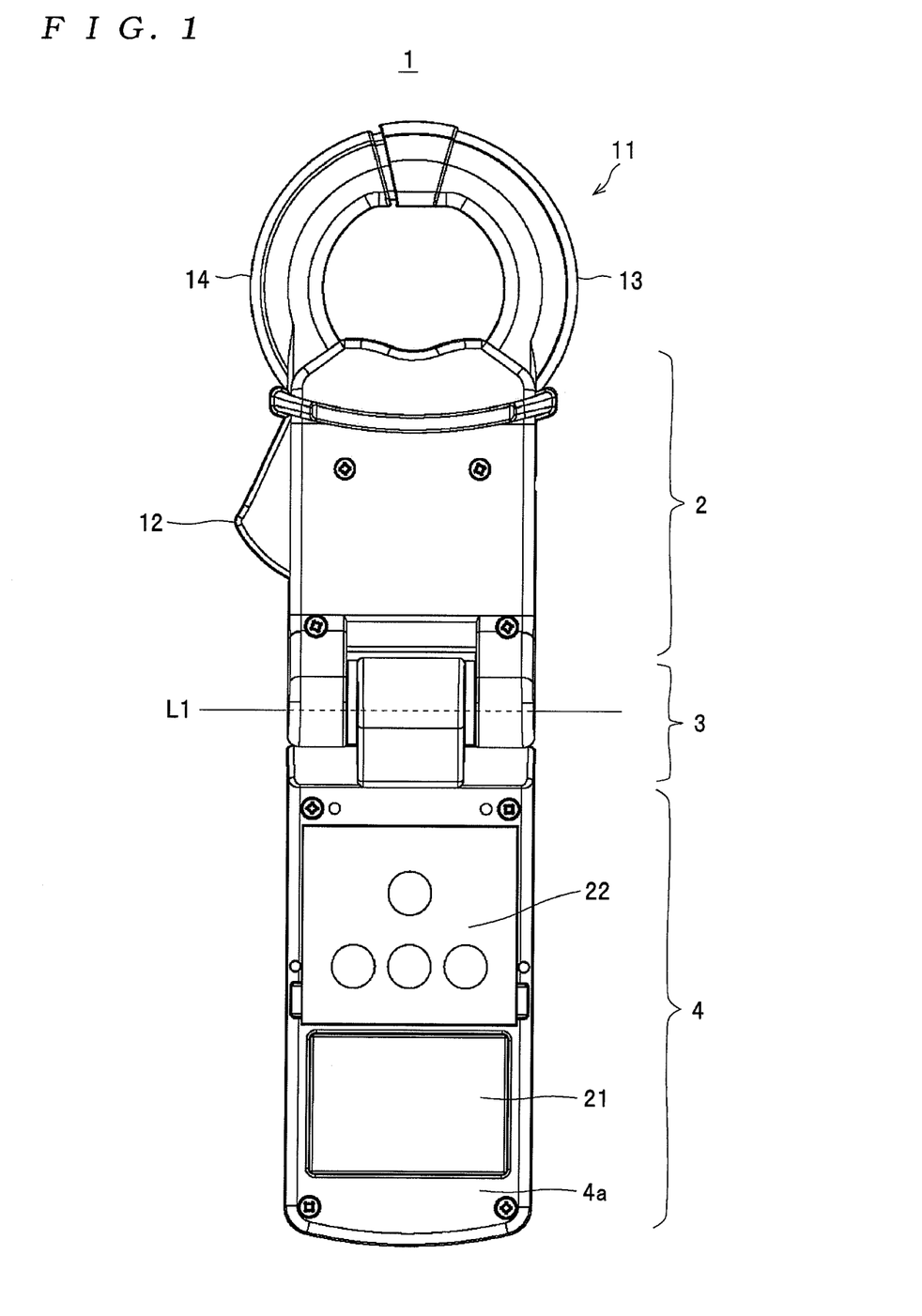
FIG. 1 is a front elevation of an ammeter in an opened state (i.e., a state where a second main unit has been rotated by around 180° with respect to the first main unit)

As shown in FIG. 1, the ammeter 1 includes a first main unit 2, a hinge unit 3, and a second main unit 4, and is constructed so as to be capable of measuring the current flowing through a measured object 5. The external form of the first main unit 2 approximates to a rectangular solid. A clamp-type sensor ("sensor unit") 11 is integrally disposed on one side surface of the first main unit 2 (as one example, the upper surface in FIG. 1) and an opening/closing lever 12 is integrally disposed on another side surface (as one example, the left surface in FIG. 1). Note that in the present specification, the expression "the sensor 11 is integrally disposed on the first main unit 2" refers to a state where instead of being attached to the first main unit 2 by a flexible member such as a cable, the sensor 11 is connected to the first main unit 2 in a state where the relative positional relationship between the sensor 11 and the first main unit 2 cannot change. An opening/closing mechanism (not shown) that opens and closes the sensor 11 when the opening/closing lever 12 is operated is also incorporated in the first main unit 2.

Figure 4:
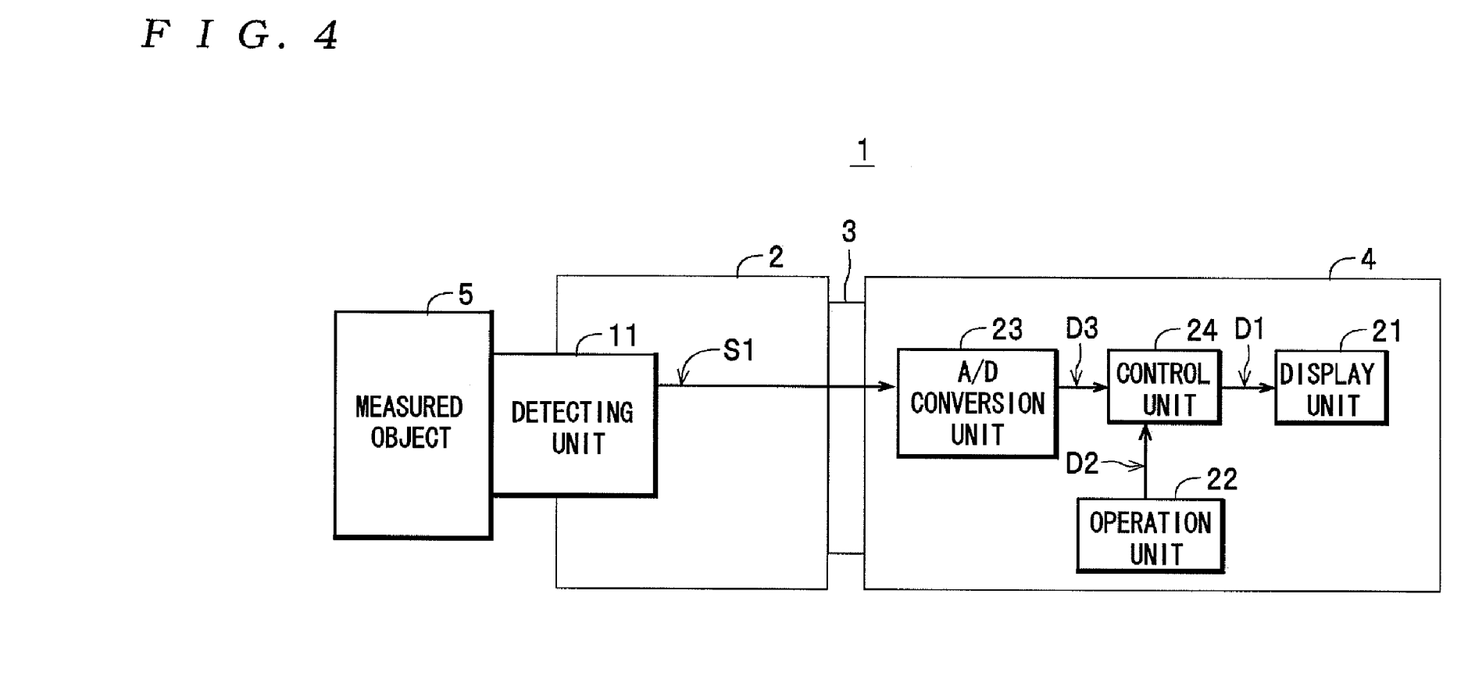
FIG. 4 is a block diagram showing the construction of the ammeter shown in FIG. 1.

The sensor 11 includes a first cover portion 13 that has an arc-shaped external form and whose base end (the lower end in FIG. 1) is rotatably attached to one side surface of the first main unit 2 (as one example, the upper surface in FIG. 1), a second cover portion 14 that has an arc-shaped external form and whose base end (the lower end in FIG. 1) is rotatably attached to one side surface of the first main unit 2 (the same surface to which the first cover portion 13 is attached, i.e., the upper surface), a pair of coils (not shown) that are disposed inside the cover portions 13 and 14 and are used to detect current, and an amplifier unit (not shown) that amplifies the voltage induced in the coils by the current flowing through the measured object 5 and outputs the voltage as a detection signal S1 (see FIG. 4). The base ends of the cover portions 13 and 14 are driven by the opening/closing mechanism that operates in concert with an operation of the opening/closing lever 12 so that the cover portions 13 and 14 rotate on the same plane about their respective base ends to move between a state where the free ends (the upper ends in FIG. 1) of the cover portions 13 and 14 are combined (i.e., a state where the sensor 11 is closed) and a state where the free ends (the upper ends in FIG. 1) of the cover portions 13 and 14 are separated (i.e., a state where the sensor 11 is opened). When the respective free ends (the upper ends in FIG. 1) of the cover portions 13 and 14 are combined (i.e., when the sensor 11 is closed), as shown in FIG. 1 the cover portions 13 and 14 maintain a substantially annular shape. By doing so, the sensor 11 is constructed so as to be able to clamp the measured object (a current line in the present embodiment). The sensor 11 outputs the detection signal S1 with a voltage value that corresponds to the value of the current flowing through the measured object 5.

Figure 2:
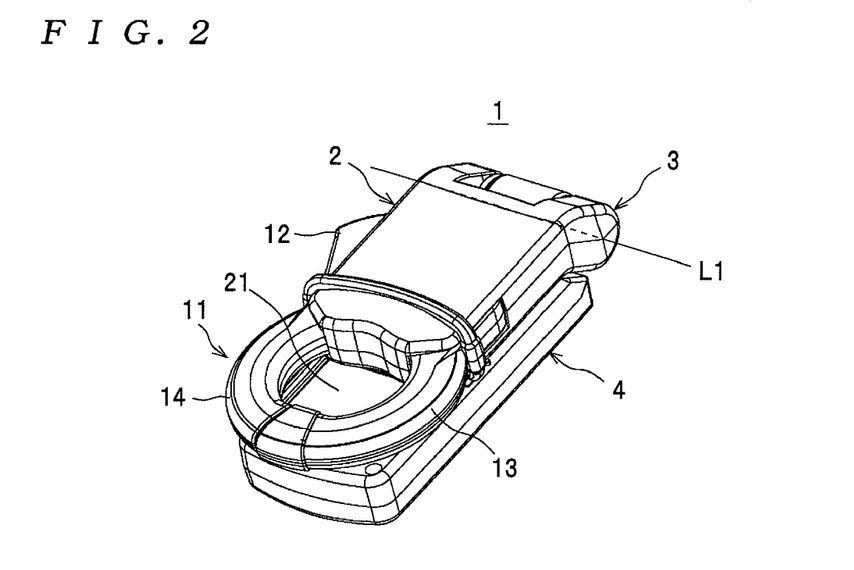
FIG. 2 is a perspective view of the ammeter shown in FIG. 1 in a folded-up state.
Figure 3:
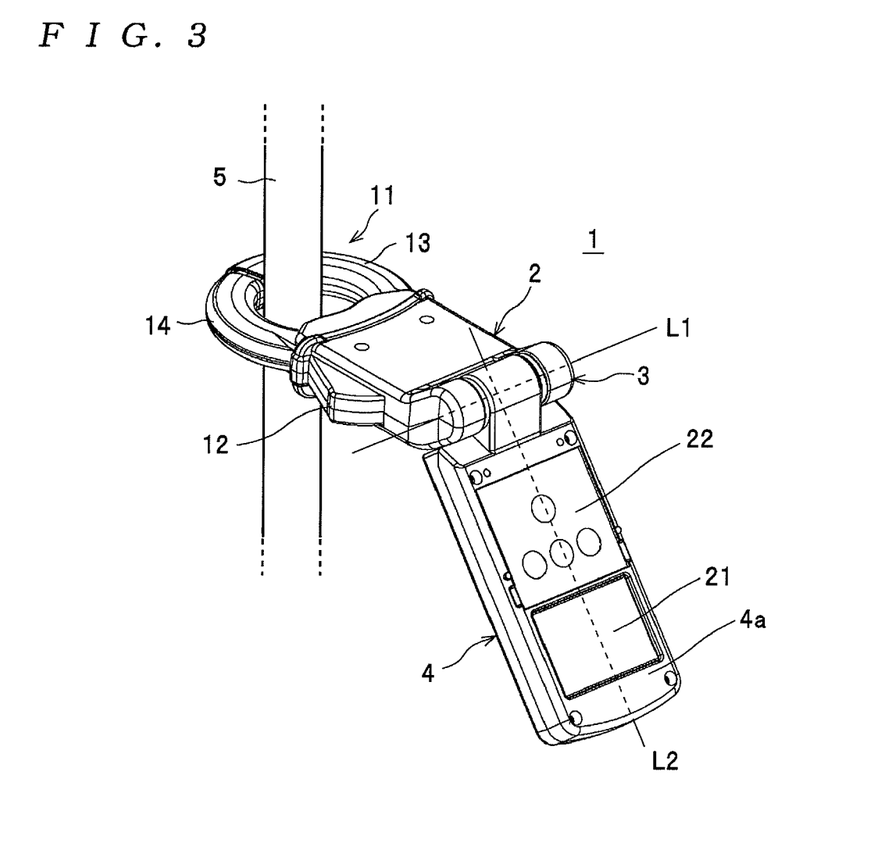
FIG. 3 is a perspective view of a state where the ammeter shown in FIG. 1 has been attached to a measured object and the second main unit has been rotated by around 240° with respect to the first main unit.

As shown in FIG. 1, the hinge unit 3 is disposed between an opposite surface (i.e., the lower surface in FIG. 1) of the first main unit 2 to the surface to which the sensor 11 is attached (i.e., the upper surface of the first main unit 2 in FIG. 1) and a side surface (i.e., the upper surface in FIG. 1) of the second main unit 4 that is formed as a rectangular solid as described later, and rotatably connects the second main unit 4 to the first main unit 2. More specifically, the hinge unit 3 is constructed using a well-known single-axis hinge mechanism (not shown) that includes a well-known friction mechanism, for example, and connects the second main unit 4 to the first main unit 2 so as to be rotatable about the axis L1 shown in FIGS. 1 to 3. Thanks to the hinge unit 3, the second main unit 4 is constructed so as to be capable of rotating from a folded position where the second main unit 4 is folded over onto the first main unit 2 (the position shown in FIG. 2) to a completely open position (a position that is rotated by an angle of over at least 180° as shown in FIG. 3, around 240° in the present embodiment). Note that the maximum rotation angle is not limited to 240°, and it is possible to make the second main unit 4 rotate by close to 360°, for example. Due to the friction function of the hinge unit 3, the second main unit 4 can be kept (stopped) at a freely chosen rotational position between the folded position and the completely open position.

As shown in FIG. 1, the second main unit 4 is formed as a rectangular solid with a length that is substantially equal to the total length of the first main unit 2 and the sensor 11 and a width that is substantially equal to the width of the first main unit 2. A display unit 21 and an operation unit (a "first operation unit" for the present invention) 22 are disposed on a surface 4a of the second main unit 4 that faces the first main unit 2 when the second main unit 4 has been folded over. Also, as shown in FIG. 4, an A/D conversion unit 23, a control unit 24, and a power supply unit (not shown) are disposed inside the second main unit 4. The power supply unit is composed of a battery or the like, and supplies power for driving the various component elements of the ammeter 1.

The display unit 21 is composed of an LCD (Liquid Crystal Display), for example, and is constructed so as to display values, such as a measured current value and the maximum measured current, under the control of the control unit 24. The display unit 21 is equipped with a backlight (not shown) to improve the visibility of characters, numbers, and the like being displayed. The backlight is turned on and off by the control unit 24. As one example, the operation unit 22 is equipped with keys such as a "HOLD" key, a "MAX" key, and a "BACKLIGHT ON/OFF" key. The operation unit 22 outputs key data D2 showing which key has been operated to the control unit 24.

The A/D conversion unit 23 carries out an A/D conversion on the detection signal S1 and outputs current data D3 with a value that corresponds to the current flowing through the measured object 5 to the control unit 24. The control unit 24 includes a CPU, a ROM in which operation programs for the CPU are stored, and an internal memory composed of RAM that is used as a working memory and the like (none of such components are shown). The control unit 24 carries out a current calculating process that calculates the current value of the current flowing through the measured object 5, the maximum value of the current, and the like, based on the current data D3 and also carries out a display process that outputs display data D1 to have the display unit 21 display the calculated current value and the like.

Next, the method of measuring the current of the measured object 5 using the ammeter 1 will be described with reference to the drawings.

First, the ammeter 1 is carried to the place where the measured object 5 is disposed. When the ammeter 1 is not being used, such as when the ammeter 1 is being carried, the ammeter 1 is kept in the folded-up state, as shown in FIG. 2. As described above, the ammeter 1 is constructed so that the length of the second main unit 4 is substantially equal to the total length of the first main unit 2 and the sensor 11 and the width of the second main unit 4 is substantially equal to the width of the first main unit 2, and therefore when the ammeter 1 is folded up, as shown in FIGS. 1 and 3, compared to when the first main unit 2 and the second main unit 4 are open, the width is the same but the length is reduced to around half. Since the external form can be made much smaller in this folded-up state, the ammeter 1 has superior portability. Since the first main unit 2 is folded over so as to hide the surface 4a of the second main unit 4 on which the display unit 21 and the operation unit 22 are disposed, this effectively prevents erroneous operation of the operation unit 22 and damage to the display unit 21 when the ammeter 1 is carried.

Next, as shown in FIG. 3, the ammeter 1 is attached to the measured object 5 (for example, a cable whose current is to be measured). When doing so, by operating the opening/closing lever 12, the free ends of the cover portions 13 and 14 are separated to open the sensor 11, and after the measured object 5 has been placed between the cover portions 13 and 14, the free ends of the cover portions 13 and 14 are bring back together. By doing so, the clamping of the measured object 5 by the sensor 11 is completed. By rotating the second main unit 4 with respect to the first main unit 2, the second main unit 4 is moved to a position which facilitates the measurement process. More specifically, the second main unit 4 is moved so that the surface 4a of the second main unit 4 on which the display unit 21 and the like are disposed is oriented so as to face the operator, thereby making it easy to check the display of the display unit 21 and to operate the operation unit 22.

In the clamped state, the sensor 11 outputs the detection signal S1 with a voltage value that corresponds to the current flowing through the measured object 5. Next, the A/D conversion unit 23 carries out an A/D conversion on the detection signal S1 and outputs the current data D3 to the control unit 24. The control unit 24 carries out the current calculating process based on the current data D3 to calculate a current value of the measured object 5 and successively stores current values in the internal memory. The control unit 24 also outputs the display data D1 to carry out the display process that updates the display of the current value of the measured object 5 calculated by the current calculating process on the display unit 21. The control unit 24 also calculates a maximum value out of the current values found by the current calculating process and updates the maximum value stored in the internal memory. The control unit 24 repeatedly carries out the current calculating process and the display process. By doing so, since the current of the measured object 5 is displayed in real time on the display unit 21, by viewing the display on the display unit 21, it is possible to measure the current flowing through the measured object 5.

When key data D2 showing the HOLD key is inputted from the operation unit 22 during execution of the current calculating process and display process, the control unit 24 stops updating the display of the current value on the display unit 21. By doing so, the current value that was displayed when the HOLD key was operated is continuously displayed on the display unit 21. This makes it possible to easily carry out processes such as writing down a measured value of the current flowing through the measured object 5 while looking at the display unit 21. Note that when key data D2 showing the HOLD key is inputted again from the operation unit 22, the control unit 24 recommences the updating of the current value displayed on the display unit 21. By doing so, the displaying of the most recently measured current of the measured object 5 on the display unit 21 is recommenced.

When key data D2 showing the MAX key is inputted from the operation unit 22, the control unit 24 reads the maximum value from the internal memory and displays the maximum value on the display unit 21. By doing so, since the maximum value of the current flowing through the measured object 5 up to the present time is displayed on the display unit 21, it is possible to measure the maximum value of the current. When key data D2 showing the backlight ON/OFF key is inputted from the operation unit 22, the control unit 24 has the backlight of the display unit 21 switched on. By doing so, it becomes possible for the operator to easily view the display of the display unit 21 composed of an LCD even in a dark place.

In this way, according to the ammeter 1, by connecting the second main unit 4 (on which the display unit 21 is disposed) so that the second main unit 4 is rotatable with respect to the first main unit 2 (on which the sensor 11 to be attached to the measured object 5 is disposed) and rotating the second main unit 4, it will be possible to place the display unit 21 at a position which makes the display unit 21 easy to view, regardless of the orientation and the position of the measured object 5. As a result, according to the ammeter 1, it is possible to sufficiently facilitate measuring operations. Also, by connecting the second main unit 4 to the first main unit 2 via the hinge unit 3 so that the second main unit 4 can be kept at a freely chosen rotational position (i.e., a position where the second main unit 4 is rotated with respect to the first main unit 2), it becomes no longer necessary to hold the second main unit 4 by hand at a position where the display unit 21 is easy to view. This means the operator can freely use both hands and can write down the measurement results, for example, which makes it possible to further facilitate measuring operations.

With the ammeter 1, the clamp-type sensor (clamp sensor) 11 that can clamp the measured object 5 is integrally disposed on the first main unit 2. This type of sensor 11 is constructed so that the facing end surfaces of the coils inside the cover portions 13 and 14 touch each other (i.e., are connected) when the cover portions 13 and 14 are closed. However, since it is easy for such facing end surfaces of the coils to become separated when a large external force is applied to the sensor 11 (i.e., to the cover portions 13 and 14), this can cause a drop in measurement accuracy. This kind of external force can often occur when the first main unit 2 is twisted in a state where the measured object 5 is clamped by the sensor 11, but with the ammeter 1, as described above, the second main unit 4 on which the display unit 21 is disposed is rotatably connected via the hinge unit 3 to the first main unit 2 on which the sensor 11 is disposed. This means that by rotating the second main unit 4, it is possible to position the second main unit 4 so that the display unit 21 is always easy to view without applying an unnecessary external force to the first main unit 2, that is, to the sensor 11. Accordingly, since it is possible to always keep the pair of facing end surfaces of the coils of the sensor 11 in a favorably connected state, measurement processes can be carried out without a drop in the measurement accuracy.

Since the ammeter 1 is constructed so that the first main unit 2 and the second main unit 4 can be folded up, it is possible to make the ammeter 1 more compact when the ammeter 1 is not in use, which gives the ammeter 1 favorable portability. By disposing the display unit 21 on the surface 4a of the second main unit 4 that faces the first main unit 2 when the ammeter 1 is folded up, it is possible to protect the display unit 21 from damage and the like when the ammeter 1 is being carried.

According to the ammeter 1, by disposing the operation unit 22 on the surface 4a of the second main unit 4 and rotating the second main unit 4, it is possible to simultaneously achieve both favorable visibility for the display unit 21 and favorable operability for the operation unit 22, regardless of the orientation and position of the measured object 5. Also, by disposing both the display unit 21 and the operation unit 22 on the surface 4a of the second main unit 4 that faces the first main unit 2 when the ammeter 1 is folded up, it is possible to simultaneously protect both the display unit 21 and the operation unit 22 during transportation and the like of the ammeter 1.

Note that the present invention is not limited to the construction described above. For example, although the ammeter 1 described above is constructed so that the display unit 21 and the operation unit 22 are disposed on the surface 4a of the second main unit 4, it is also possible to use a construction where the operation unit 22 is disposed on a different surface to the display unit 21. More specifically, for an ammeter 1 that mainly measures changes in the current flowing through the measured object 5 displayed on the display unit 21 and where few operations of the operation unit 22 are made during measuring, it is possible to dispose the operation unit 22 on a surface of the second main unit 4 that is behind the surface 4a on which the display unit 21 is disposed. Also, although the A/D conversion unit 23 is disposed inside the second main unit 4, the A/D conversion unit 23 may be disposed inside the first main unit 2 instead.

Also, although the hinge unit 3 in the ammeter 1 described above is constructed using a single-axis hinge mechanism, it is also possible to construct the hinge unit 3 using a well-known dual-axis hinge mechanism. By doing so, it will be possible to rotate the second main unit 4 with respect to the first main unit 2 about the axis L1 and also about an axis L2 that is perpendicular to the axis L1 (see FIG. 3), which makes it possible to significantly improve the visibility of the display unit 21. Also, even if the operation unit 22 is provided on the surface of the second main unit 4 that is behind the surface 4a on which the display unit 21 is disposed, it can still be possible to improve the operability of the operation unit 22.

Also, although the ammeter 1 described above uses a construction where the first main unit 2 and the second main unit 4 fold up for favorable portability and storability, when the sole object is to achieve favorable visibility for the display unit 21 of the second main unit 4, as one example it is possible to use a construction where the second main unit 4 can rotate by around ±90° from a state where the first main unit 2 and the second main unit 4 are positioned on the same plane. In addition, although the mechanism for switching on the power supply has not been described for the ammeter 1 described above, it is possible to use a well-known construction. For example, it is possible to use a construction where a power switch is disposed on the operation unit 22 and the power switch is operated to control the supplying of power from a battery to the various component elements. Alternatively, it is also possible to use a construction where the ammeter 1 is switched off in the folded-up state and a switch for turning on the ammeter 1 in the non-folded-up state (i.e., the opened state) is provided so that the power is automatically turned on when the ammeter 1 is opened.

Also, although an example where the present invention is applied to the ammeter 1 has been described above, it should be obvious that aside from an ammeter, it is also possible to apply the present invention to measuring apparatuses that measure various electrical characteristics, such as a voltmeter and an electric power meter, and to measuring apparatuses aside from measuring apparatuses that measure electrical characteristics (for example, a thermometer) where there is the risk that a limited orientation of a display unit during measuring will make it difficult to view the display unit.

Second Embodiment

Another embodiment of a measuring apparatus according to the present invention will now be described with reference to the attached drawings.

Figure 5:
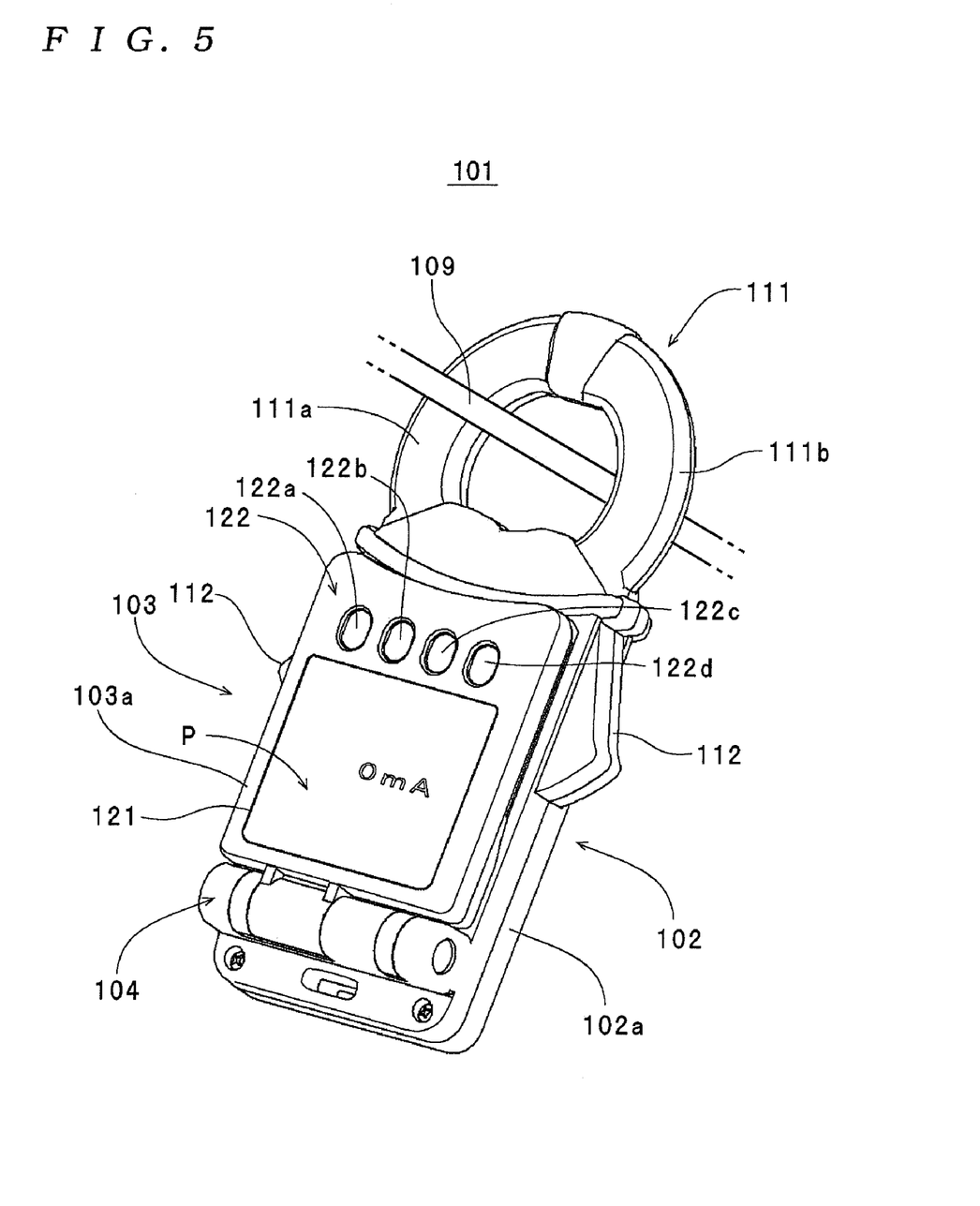
FIG. 5 is a perspective view showing the appearance of another ammeter in a folded-up state.
Figure 6:
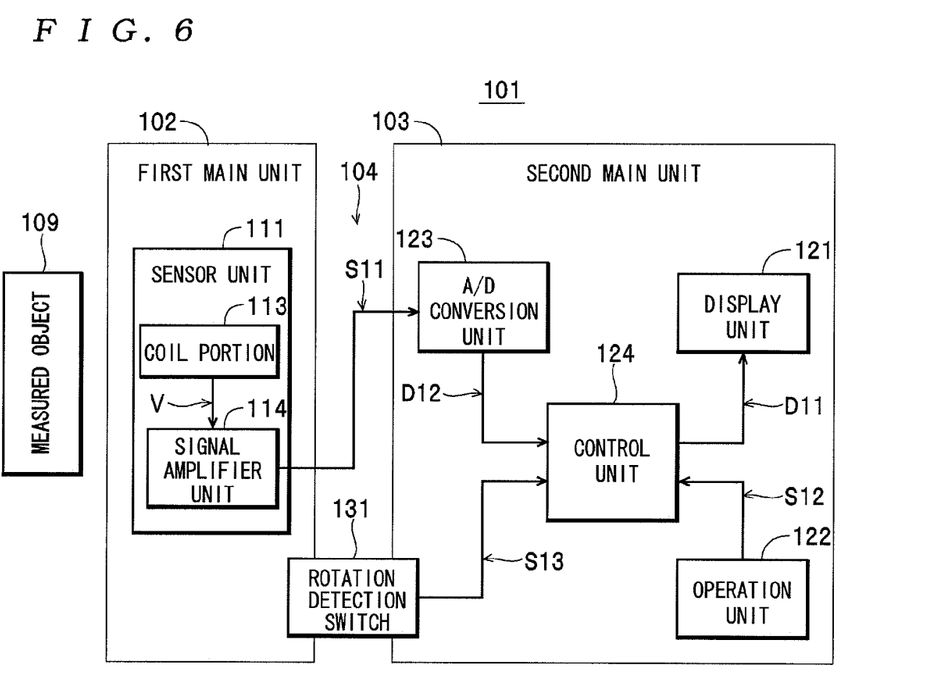
FIG. 6 is a block diagram showing the construction of the ammeter shown in FIG. 5.

The clamp-type ammeter (hereinafter, simply "ammeter") 101 shown in FIGS. 5 and 6 is one example of a "measuring apparatus" for the present invention, includes a first main unit 102, a second main unit 103, and a hinge unit 104, and is constructed so as to be capable of measuring the current that flows through a measured object 109 and the like. As shown in FIG. 5, the first main unit 102 is constructed so that the measuring sensor unit 111 and a pair of opening/closing levers 112 are disposed at one end of a case 102a of the first main unit 102 that is formed for example of an insulating resin material. The second main unit 103 is rotatably connected to the other end of the case 102a via the hinge unit 104. An opening/closing mechanism (not shown) that opens and closes the sensor unit 111 when the opening/closing levers 112 are operated is enclosed inside the case 102a.

The sensor unit 111 has a first cover portion 111a that has an arc-shaped external form and whose base end is rotatably attached to one side surface of the case 102a, a second cover portion 111b that has an arc-shaped external form and whose base end is rotatably attached to one side surface of the case 102a (the same surface to which the first cover portion 111a is attached), a pair of coils 113 that are disposed inside the cover portions 111a and 111b and are used to detect current, and a signal amplifier unit 114 that amplifies the voltage V induced in the coils 113 by the current flowing through the measured object 109 and outputs the voltage as a detection signal S11 (see FIG. 6). By doing so, when the sensor unit 111 clamps the measured object 109, the sensor unit 111 outputs the detection signal S11 with a voltage value corresponding to the current flowing through the measured object 109.

Figure 12:
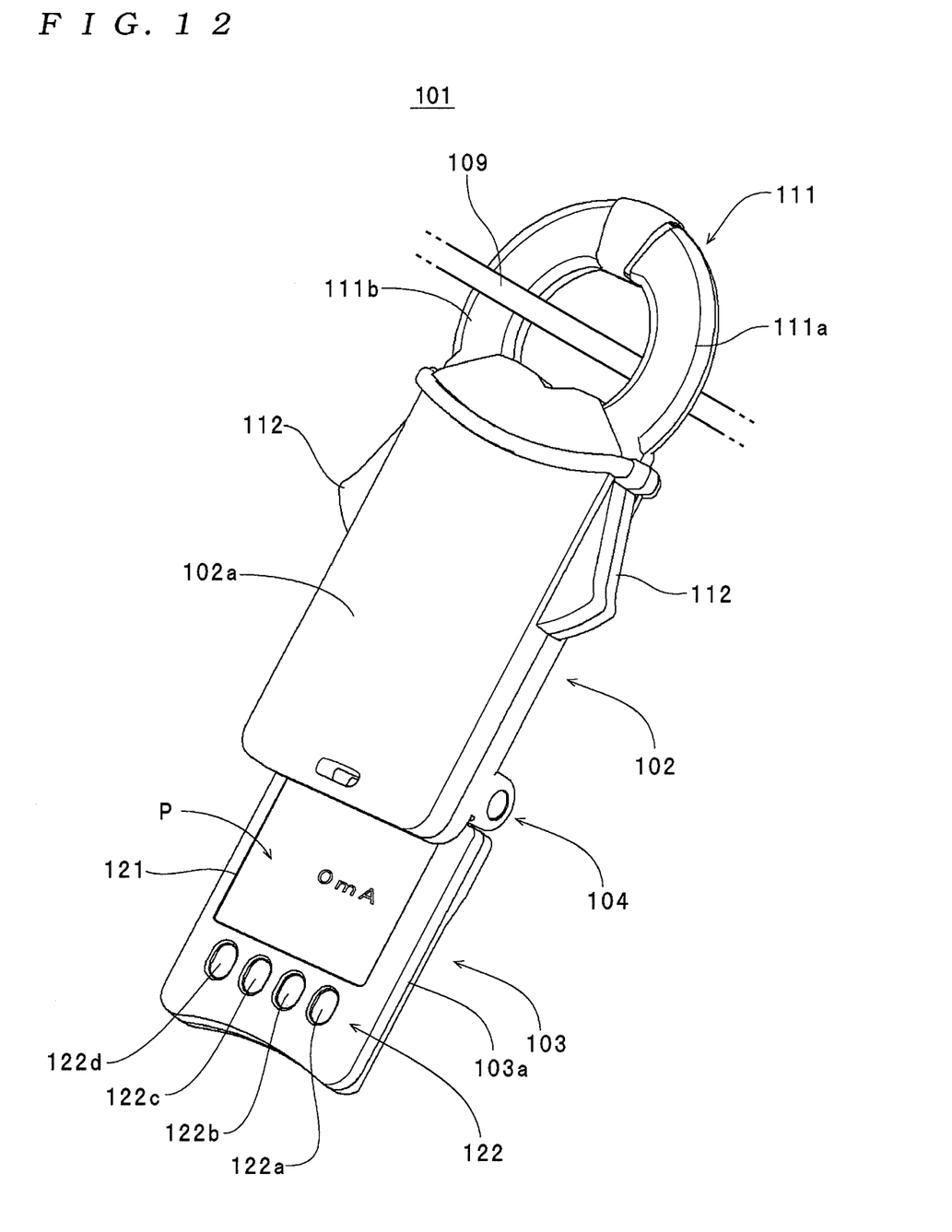
FIG. 12 is a perspective view showing the appearance of the ammeter shown in FIG. 5 in an opened state.

The respective base ends of the cover portions 111a and 111b are driven by the opening/closing mechanism that operates in concert with an operation of the opening/closing levers 112 so that the cover portions 111a and 111b rotate on the same plane with respect to the case 102a about their respective base ends to move between a state where the free ends of the cover portions 111a and 111b are combined (i.e., a state where the sensor unit 111 is closed) and a state where the free ends of the cover portions 111a and 111b are separated (i.e., a state where the sensor unit 111 is opened). When the respective free ends of the cover portions 111a and 111b are combined, as shown in FIGS. 5 and 12 the cover portions 111a and 111b maintain a substantially annular shape. By doing so, the sensor unit 111 is constructed so as to be able to clamp the measured object 109 (for example, a current line) by encircling the measured object 109.

The second main unit 103 is constructed so that a display unit 121 and an operation unit 122 (a "second operation unit" for the present invention) are disposed on one surface of a case 103a which is formed for example of an insulating resin material. Also, as shown in FIG. 6, an A/D conversion unit 123, a control unit 124, and a power supply unit (for example, a primary cell), not shown, are disposed inside the case 103a. The display unit 121 is composed of an LCD (Liquid Crystal Display) panel and a backlight, for example. In accordance with control by the control unit 124, as shown in FIGS. 7 to 10, the display unit 121 displays a measurement screen P (one example of a "screen" for the present invention) showing the measured current, the maximum out of the current values measured within a predetermined time, and the like.

As shown in FIG. 5, the operation unit 122 includes a "HOLD" switch 122a, a "MAX" switch 122b, a "BACKLIGHT ON/OFF" switch 122c, and a display screen rotation switch 122d (one example of a "rotation operation switch" for the present invention: hereinafter simply "rotation switch"), and outputs an operation signal S12 (see FIG. 6) that corresponds to an operated switch to the control unit 124. With the ammeter 101, the operation signal S12 outputted from the operation unit 122 when the rotation switch 122d is operated corresponds to a "screen rotation designating signal".

As shown in FIG. 6, the A/D conversion unit 123 carries out an A/D conversion process on the detection signal S11 outputted from the signal amplifier unit 114 of the sensor unit 111 to generate current data D12 with a value that corresponds to the current flowing through the measured object 109, and outputs the current data D12 to the control unit 124.

The control unit 124 includes an operation unit (CPU), a ROM in which operation programs for the operation unit are stored, and a RAM that is used as a working memory and the like. The control unit 124 carries out a calculating process that calculates the current flowing through the measured object 109, the maximum value of the current, and the like based on the current data D12 outputted from the A/D conversion unit 123. The control unit 124 also corresponds to a "display control unit" for the present invention, generates display data D11 for displaying a measurement screen P based on the result of the calculation process, and outputs the display data D11 to the display unit 121.

Figure 7:
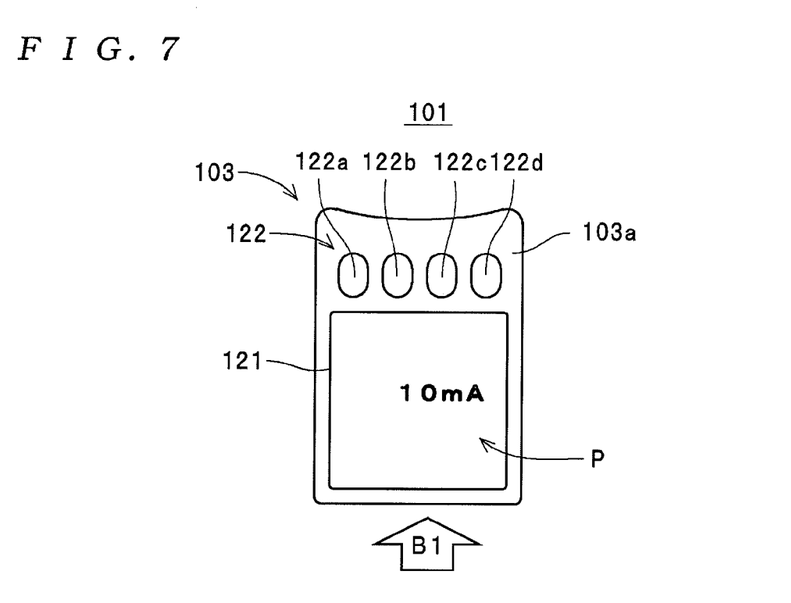
FIG. 7 is a front elevation of a second main unit in a state where a measurement screen is displayed in a first display mode that is the default mode.

In addition, when the second main unit 103 has been rotated with respect to the first main unit 102 as described later (i.e., when a detection signal S13 is outputted from a rotation detection switch 131 described later) and/or when the rotation switch 122d has been operated (i.e., when an operation signal S12 that designates a rotation operation is outputted from the operation unit 122), the control unit 124 has the measurement screen P rotated by a predetermined angle and displayed on the display unit 121. More specifically, as shown in FIG. 7, when the display unit 121 is oriented with the operation unit 122 positioned above the display unit 121 or when the display unit 121 is being viewed in the direction of the arrow B1 (such orientation is referred to as the "normal position"), the control unit 124 generates display data D11 in a first display mode as the default display mode to make the measurement screen P easy to view.

Figure 8:
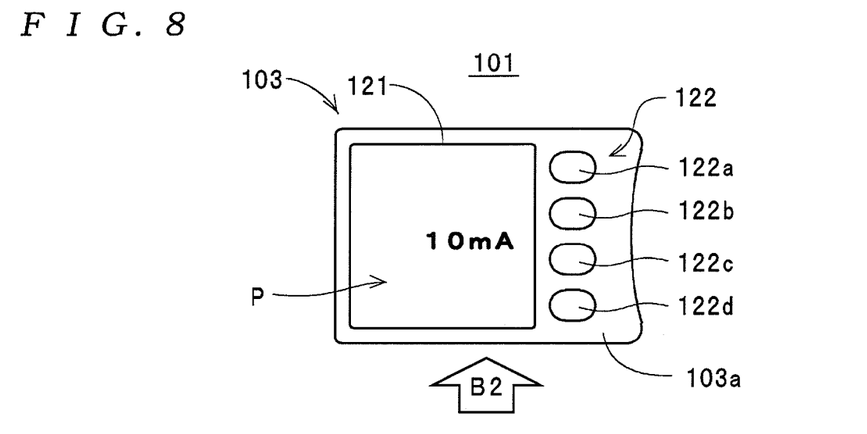
FIG. 8 is a front elevation of the second main unit in a state where the measurement screen is displayed in a second display mode.
Figure 9:
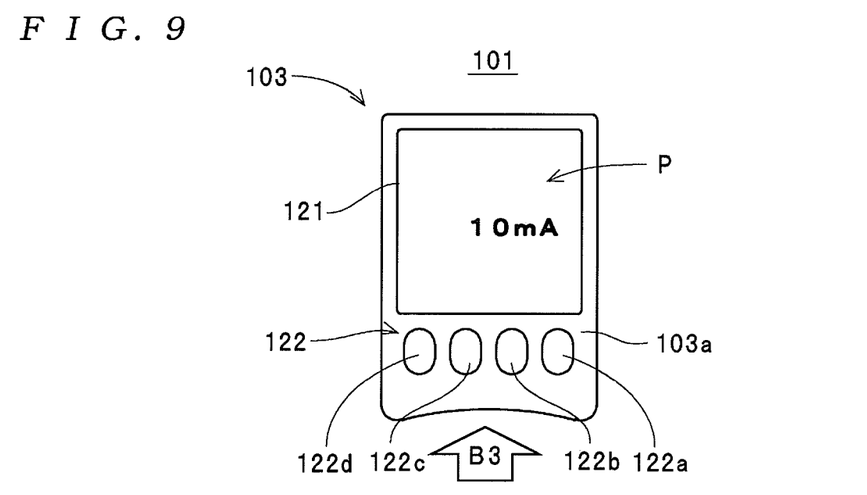
FIG. 9 is a front elevation of the second main unit in a state where the measurement screen is displayed in a third display mode.
Figure 10:
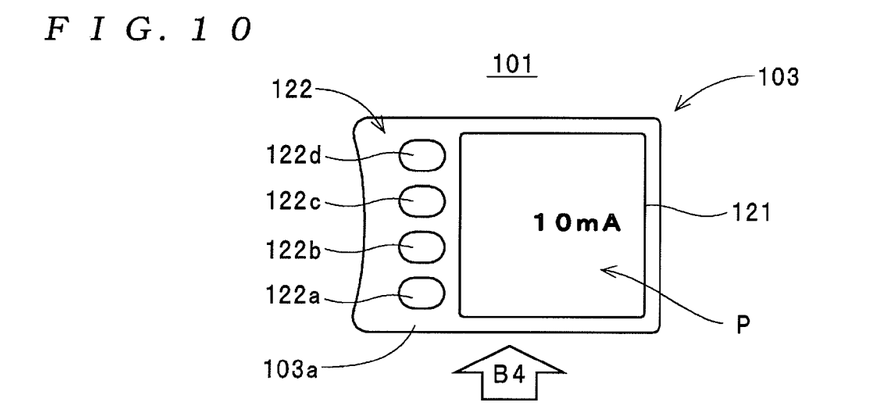
FIG. 10 is a front elevation of the second main unit in a state where the measurement screen is displayed in a fourth display mode.

The control unit 124 generates the display data D11 so that the measurement screen P is displayed in one out of four display modes. As shown in FIG. 8, in the second display mode, the measurement screen P is easy to view when the display unit 121 has been oriented with the operation unit 122 on the right of the display unit 121 (i.e., when the display unit 121 has been rotated clockwise by 90° from the normal position) or when the display unit 121 is being viewed in the direction of the arrow B2. As shown in FIG. 9, in the third display mode, the measurement screen P is easy to view when the display unit 121 has been oriented with the operation unit 122 below the display unit 121 (i.e., when the display unit 121 has been rotated clockwise or anticlockwise by 180° from the normal position) or when the display unit 121 is being viewed in the direction of the arrow B3. As shown in FIG. 10, in the fourth display mode, the measurement screen P is easy to view when the display unit 121 has been oriented with the operation unit 122 to the left of the display unit 121 (i.e., when the display unit 121 has been rotated clockwise by 270° or anticlockwise by 90° from the normal position) or when the display unit 121 is being viewed in the direction of the arrow B4.

As shown in FIG. 5, the hinge unit 104 connects an end of the case 102a of the first main unit 102 that is opposite the end where the sensor unit 111 is attached to one end of the case 103a of the second main unit 103 and permits the second main unit 103 to rotate with respect to the first main unit 102. In this way, the ammeter 101 is constructed so that measurement of current or the like can be carried out both in a "folded-up state" where the second main unit 103 is placed on the first main unit 102 as shown in FIG. 5 and an "opened state" where the second main unit 103 has been rotated with respect to the first main unit 102 about the hinge unit 104 as shown in FIG. 12.

A signal cable (for example, a flat cable) for connecting the sensor unit 111 of the first main unit 102 and the A/D conversion unit 123 of the second main unit 103 and a rotation detection switch 131 (a "rotation detecting unit" for the present invention: see FIGS. 6 and 11) that detects rotation of the second main unit 103 with respect to the first main unit 102 and outputs a detection signal S13 (another example of a "screen rotation designating signal": see FIG. 6) are disposed in the hinge unit 104. In the ammeter 101, a mechanical switch is used as the rotation detection switch 131, for example, a main part of the rotation detection switch 131 (the part shown by the dashed line in FIG. 11) is disposed inside the case 102a of the first main unit 102, and a contact (not shown) of the rotation detection switch 131 is disposed inside the hinge unit 104 so that rotation of the second main unit 103 with respect to the first main unit 102 can be detected.

Figure 11:
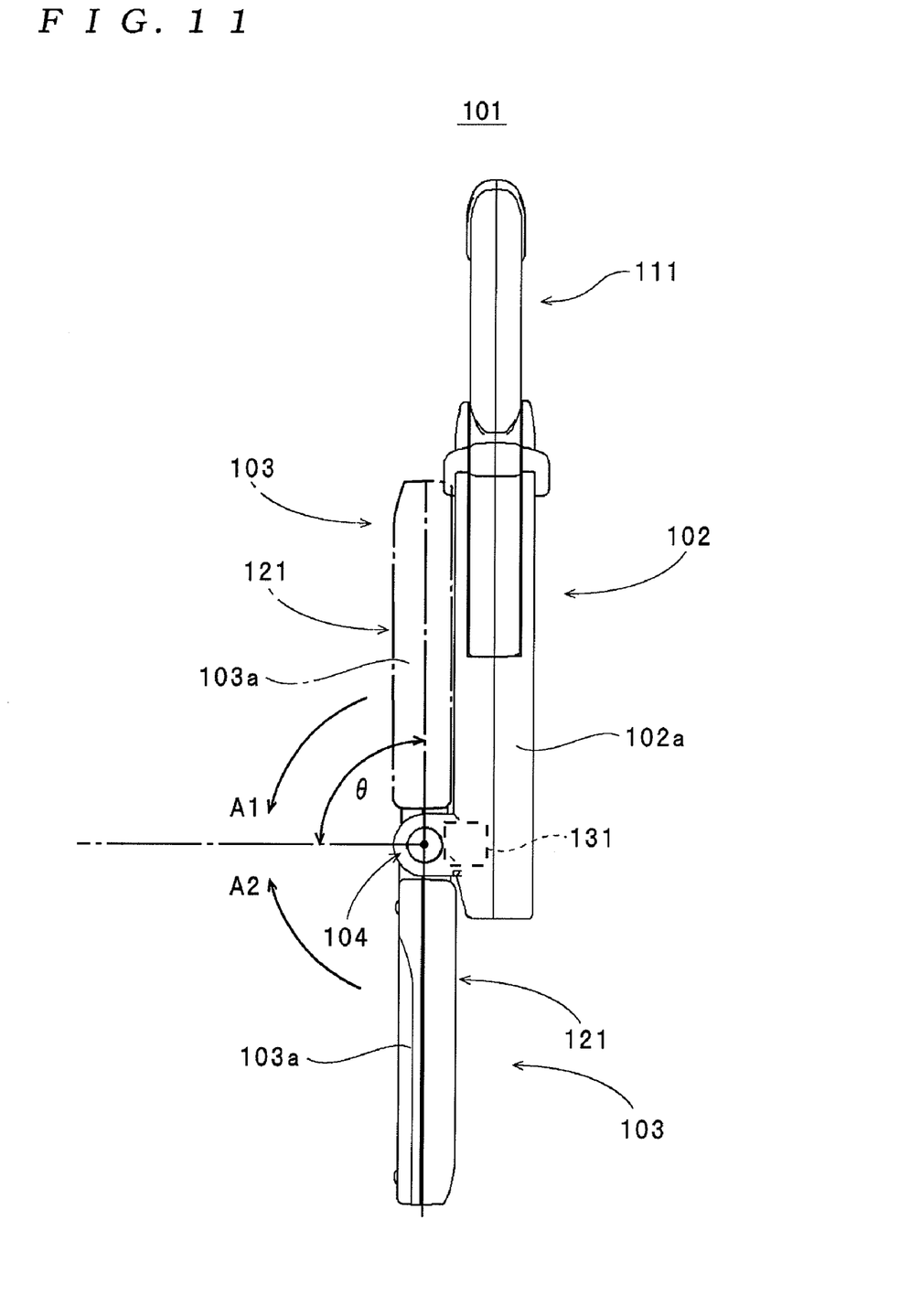
FIG. 11 is a side elevation of the ammeter shown in FIG. 5.

More specifically, with the ammeter 101, the rotation detection switch 131 outputs the detection signal S13 to the control unit 124 when an angle $\theta$ of over 90°, for example, is made between the first main unit 102 and the second main unit 103 due to the second main unit 103 having been rotated in the direction of the arrow A1 with respect to the first main unit 102 about the hinge unit 104 from the state where the ammeter 101 is folded up (shown by the dot-dash lines in FIG. 11). The ammeter 101 is constructed so that when the angle $\theta$ described above exceeds 90°, the outputting of the detection signal S13 from the rotation detection switch 131 is continued.

The rotation detection switch 131 stops outputting the detection signal S13 when an angle $\theta$ of 90° or below, for example, is made between the first main unit 102 and the second main unit 103 due to the second main unit 103 having been rotated in the direction of the arrow A2 with respect to the first main unit 102 about the hinge unit 104 from the state where the ammeter 101 is opened (the state shown by the solid lines in FIG. 11). Accordingly, based on whether the detection signal S13 is being outputted from the rotation detection switch 131, the control unit 124 can determine whether the ammeter 101 is in the folded-up state or in the opened state. Note that the angle $\theta$ described above that is used to judge whether the detection signal S13 should be outputted is not limited to 90° and can be set as desired.

The ammeter 101 can be made compact by placing the ammeter 101 in the folded-up state, which improves portability. When the current flowing through the measured object 109 is measured, it is possible to carry out the measurement process in one of the folded-up state and the opened state in accordance with the location of the measured object 109 and the measurement environment, such as whether any obstacles are present nearby. More specifically, when there is insufficient space around the measured object 109, for example, the ammeter 101 is used in the folded-up state. When doing so, the operator first operates the opening/closing levers 112 to separate the free ends of the cover portions 111a and 111b and open the sensor 11, the measured object 109 is placed within the cover portions 111a and 111b, and then the operator removes his/her hand from the opening/closing levers 112 to bring the free ends of the cover portions 111a and 111b back together. By doing so, as shown in FIG. 5, the clamping of the measured object 109 by the sensor unit 11 is completed.

After this, by operating one of the operation switches of the operation unit 122, the ammeter 101 is activated. At this time, the detection signal S11 with a voltage value corresponding to the current flowing through the measured object 109 is outputted from the sensor unit 111. The detection signal S11 is subjected to A/D conversion by the A/D conversion unit 123 to generate the current data D12, and the current data D12 is outputted to the control unit 124. Next, the control unit 124 carries out the current calculating process based on the current data D12 to calculate the current of the measured object 109 and successively stores current values in the internal memory. The control unit 124 also generates the display data D11 to display the measured current and outputs the display data D11 to the display unit 121. By doing so, as shown in FIG. 7, the measurement screen P, which displays a measurement result such as "10 mA", is displayed in the first display mode on the display unit 121.

Here, if the measured object 109 is clamped with the sensor unit 111 positioned to the right of the display unit 121 of the ammeter 101 in the folded-up state (for example, when the measured object 109 is clamped with the ammeter 101 horizontal having been rotated clockwise by 90° from the operator's viewpoint), the rotation switch 122d of the operation unit 122 is operated once. When doing so, in accordance with the operation signal S12 outputted from the operation unit 122, the control unit 124 generates new display data D11 where the measurement screen P (see FIG. 7) displayed in the first display mode is rotated for example clockwise by 90° (one example of a "predetermined angle" for the present invention), and outputs the display data D11 to the display unit 121. By doing so, as shown in FIG. 8, the measurement screen P on which the measurement result of "10 mA" is displayed is displayed in the second display mode on the display unit 121.

Also, if the measured object 109 is clamped with the sensor unit 111 positioned below the display unit 121 of the ammeter 101 in the folded-up state (for example, when the measured object 109 is clamped with the ammeter 101 upside down), the rotation switch 122d of the operation unit 122d is operated twice. When doing so, in accordance with the operation signal S12 outputted from the operation unit 122, the control unit 124 generates new display data D11 where the measurement screen P (see FIG. 7) displayed in the first display mode is rotated for example clockwise by 180° (another example of a "predetermined angle" for the present invention), and outputs the display data D11 to the display unit 121. By doing so, as shown in FIG. 9, the measurement screen P on which the measurement result of "10 mA" is displayed is displayed in the third display mode on the display unit 121.

Also, if the measured object 109 is clamped with the sensor unit 111 positioned to the left of the display unit 121 of the ammeter 101 in the folded-up state (for example, when the measured object 109 is clamped with the ammeter 101 horizontal and in the opposite orientation to the orientation shown in FIG. 5), the rotation switch 122d of the operation unit 122 is operated three times. When doing so, in accordance with the operation signal S12 outputted from the operation unit 122, the control unit 124 generates new display data D11 where the measurement screen P (see FIG. 7) displayed in the first display mode is rotated for example clockwise by 270° (yet another example of a "predetermined angle" for the present invention), and outputs the display data D11 to the display unit 121. By doing so, as shown in FIG. 10, the measurement screen P on which the measurement result of "10 mA" is displayed is displayed in the fourth display mode on the display unit 121.

On the other hand, when there is sufficient space around the measured object 109, the ammeter 101 is used in the opened state. More specifically, as shown by the solid lines in FIG. 11, by rotating the second main unit 103 in the direction of the arrow A1 about the hinge unit 104 with respect to the first main unit 102, the ammeter 101 is placed in the opened state. Here, when the angle between the first main unit 102 and the second main unit 103 exceeds 90°, the detection signal S13 is outputted from the rotation detection switch 131. Note that if the ammeter 101 is in a stopped state (i.e., if the ammeter 101 is off), the detection signal S13 will not be outputted from the rotation detection switch 131 when the second main unit 103 is rotated with respect to the first main unit 102. Instead, output of the detection signal S13 from the rotation detection switch 131 commences later when one of the operation switches of the operation unit 122 has been operated to activate the ammeter 101.

Next, by operating the opening/closing levers 112, the sensor unit 111 is opened and the measured object 109 is placed within the cover portions 111a and 111b. The operator then removes his/her hand from the opening/closing levers 112 to bring the free ends of the cover portions 111a and 111b back together. By doing so, as shown in FIG. 12, the clamping of the measured object 109 by the sensor unit 111 is completed. After this, by operating one of the operation switches of the operation unit 122, the ammeter 101 is activated. At this time, the detection signal S11 is outputted from the sensor unit 111. the A/D conversion unit 123 generates the current data D12 corresponding to the detection signal S11, and the current data D12 is outputted to the control unit 124.

Next, the control unit 124 carries out the current calculating process based on the current data D12 to calculate the current of the measured object 109 and successively stores current values in the internal memory. The control unit 124 also generates the display data D11 for displaying the measured current and outputs the display data D11 to the display unit 121. At this time, as described above, since the second main unit 103 is rotated with respect to the first main unit 102 to place the ammeter 101 in the opened state, the rotation detection switch 131 will be outputting the detection signal S13. Accordingly, as shown in FIG. 12, the control unit 124 generates display data D11 where the measurement screen P is rotated clockwise or anticlockwise by 180° (another example of a "predetermined angle" for the present invention) from the first display mode, and outputs the display data D11 to the display unit 121. By doing so, as shown in FIG. 9, the measurement screen P on which the measurement result of "10 mA" is displayed is displayed in the third display mode on the display unit 121.

Here, if the measured object 109 is clamped in a state where the sensor unit 111 is positioned to the right of the display unit 121 of the ammeter 101 in the opened state, the rotation switch 122d of the operation unit 122 is operated once. In accordance with the operation signal S12 outputted from the operation unit 122, the control unit 124 generates new display data D11 where the measurement screen P (see FIG. 9) displayed in the third display mode is rotated clockwise by 90° (yet another example of a "predetermined angle" for the present invention), and outputs the display data D11 to the display unit 121. By doing so, as shown in FIG. 10, the measurement screen P on which the measurement result of "10 mA" is displayed is displayed in the fourth display mode on the display unit 121.

Also, if the measured object 109 is clamped in a state where the sensor unit 111 is positioned below the display unit 121 of the ammeter 101 in the opened state, the rotation switch 122d of the operation unit 122 is operated twice. Here, in accordance with the operation signal S12 outputted from the operation unit 122, the control unit 124 generates new display data D11 where the measurement screen P (see FIG. 9) displayed in the third display mode is rotated for example clockwise or anticlockwise by 180° (yet another example of a "predetermined angle" for the present invention), and outputs the display data D11 to the display unit 121. By doing so, as shown in FIG. 7, the measurement screen P on which the measurement result of "10 mA" is displayed is displayed in the first display mode on the display unit 121.

Also, if the measured object 109 is clamped in a state where the sensor unit 111 is positioned to the left of the display unit 121 of the ammeter 101 in the opened state, the rotation switch 122d of the operation unit 122 is operated three times. Here, in accordance with the operation signal S12 outputted from the operation unit 122, the control unit 124 generates new display data D11 where the measurement screen P (see FIG. 9) displayed in the third display mode is rotated for example clockwise by 270° or anticlockwise by 90° (yet another example of a "predetermined angle" for the present invention), and outputs the display data D11 to the display unit 121. By doing so, as shown in FIG. 8, the measurement screen P on which the measurement result of "10 mA" is displayed is displayed in the second display mode on the display unit 121.

When the second main unit 103 is rotated with respect to the first main unit 102 about the hinge unit 104 in the direction of the arrow A2 shown in FIG. 11 to return the ammeter 101 from the opened state to the folded-up state, when the angle θ between the first main unit 102 and the second main unit becomes 90° or below, outputting of the detection signal S13 from the rotation detection switch 131 is stopped. At this point, the control unit 124 has the display unit 121 display the measurement screen P in the first display mode by rotating the measurement screen P displayed in the third display mode on the display unit 121 by 180° clockwise or anticlockwise, for example.

In this way, according to the clamp-type ammeter 101, when a screen rotation designating signal (in this example, the detection signal S13 from the rotation detection switch 131 or the operation signal S12 from the operation unit 122) is outputted, the control unit 124 has the display unit 121 display a measurement screen P that has been rotated by a predetermined angle. Therefore, unlike a conventional ammeter constructed so that the measurement screen is displayed in a fixed manner and is easy to view only when the measured object has been clamped so that the conductor-introducing unit (i.e., the sensor unit) is positioned above the display unit, it will be possible to easily view the measurement screen P even when the ammeter 101 is horizontal or is upside down.

Also, according to the clamp-type ammeter 101, when the detection signal S13 is outputted from the rotation detection switch 131 in response to rotation of the second main unit 103 with respect to the first main unit 102, the control unit 124 has the measurement screen P rotated by a predetermined angle (in this example, 180°) and displayed on the display unit 121. This means that by merely rotating the second main unit 103 with respect to the first main unit 102 without carrying out a switch operation or the like to rotate the measurement screen P, it is easy to display a measurement screen P that is easy to view when the ammeter 101 is folded up and a measurement screen P that is easy to view when the ammeter 101 is opened.

In addition, according to the clamp-type ammeter 101, when the operation signal S12 is outputted from the operation unit 122 in response to an operation of the rotation switch 122d, the control unit 124 has the measurement screen P rotated by a predetermined angle (in this example, 90°) and displayed by the display unit 121, so that by operating the rotation switch 122d in accordance with the posture of the ammeter 101 when the measured object 109 has been clamped, it is possible to have the measurement screen P displayed on the display unit 121 having been rotated by a freely chosen angle that makes the measurement screen P easy to view.

Note that the present invention is not limited to the construction described above. For example, although an example where the construction of the measuring apparatus according to the present invention is applied to the clamp-type ammeter 101 has been described, it is possible to apply the present invention to various types of electric measuring apparatuses, such as an electroscope and a multitester, and to various types of measuring apparatuses, such as a thermometer, a volume measuring device, a photometer (a light measuring device) and a distance measuring device, and to use a construction where the display screen can be freely rotated. By doing so, in the same way as with the clamp-type ammeter 101 described above, it is possible to make a display screen that displays measurement results easy to view.

In addition, although an example where a mechanical switch is used as the rotation detection switch 131 has been described, the construction of the "rotation detecting unit" for the present invention is not limited to this and as other examples it is possible to use a construction that detects rotation of the second main unit 103 with respect to the first main unit 102 using a magnet sensor, a photosensor, or the like. Also, although an example equipped with a dedicated rotation switch 122d for rotating the measurement screen P has been described, the construction of a rotation operation switch (operation unit) for the present invention is not limited to this and it is possible to use a construction that outputs a screen rotation designating signal (the operation signal for the present invention) based on a combination of freely chosen keys (for example, simultaneous operation of a function key and a predetermined operation key) or a construction that outputs a screen rotation designating signal (the operation signal for the present invention) based on multiple operations of operation keys (for example, by an operation where a menu screen is displayed and then a desired screen display mode is selected).

In addition, although a construction has been described where the measurement screen P is rotated in units of 90° when the rotation switch 122d is operated, the angle by which the measurement screen P is rotated when the rotation operation switch is operated is not limited to 90°. It is possible to use a construction where the measurement screen P can be rotated in infinite steps using a ten key or a rotary switch, for example. By using this construction, it is possible to make the measurement screen P even easier to view.

What is claimed is:

1. A measuring apparatus comprising:
    a first main unit on which a clamp-type sensor capable of clamping a measured object is disposed;
    a second main unit that is rotatably connected to the first main unit via a hinge unit capable of maintaining an arbitrary rotation position and on which a display unit is disposed;
    a display control unit that has a screen displayed on the display unit;
    a rotation detecting unit that detects whether the second main unit is in an opened state or a folded-up state with respect to the first main unit and outputs a detection signal; and
    an operation unit including a rotation operation switch that outputs an operation signal; wherein:
    the first main unit and the second main unit are capable of being folded onto one another; and
    the display control unit has the display unit display the screen in one of a display way corresponding to the opened state and a display way corresponding to the folded-up state in accordance with the detection signal outputted from the rotation detecting unit, the display control unit rotating the screen, displayed in the display state in accordance with the detection signal, by a predetermined angle to have the display unit to display the rotated screen when the operation signal is outputted from the rotation operation switch.

* * * * *